United States Patent [19]

Salt et al.

[11] Patent Number: 5,469,557

[45] Date of Patent: Nov. 21, 1995

[54] CODE PROTECTION IN MICROCONTROLLER WITH EEPROM FUSES

[75] Inventors: Tom Salt, Chandler; Rodney Drake, Mesa, both of Ariz.

[73] Assignee: Microchip Technology Incorporated, Chandler, Ariz.

[21] Appl. No.: 26,967

[22] Filed: Mar. 5, 1993

[51] Int. Cl.[6] .............................. G06F 12/14; H04L 9/00
[52] U.S. Cl. .............................................. 395/425; 380/4
[58] Field of Search ................................. 395/400, 425; 380/3, 4, 25, 23

[56] References Cited

U.S. PATENT DOCUMENTS 4,590,552  5/1986  Guttag et al. ............................ 395/425
4,890,263  12/1989  Little ...................................... 365/218
5,357,572  10/1994  Bianco et al. ............................ 380/23

*Primary Examiner*—Rebecca L. Rudolph
*Attorney, Agent, or Firm*—O'Connor Cavanagh

[57] ABSTRACT

A semiconductor microcontroller device is adapted to control the operation of an external system. The device includes a CPU, program memory for storing instructions to be executed by the CPU to perform its control functions, and data memory for storing data for selective retrieval by the CPU. The contents of either memory are code protected by an EEPROM fuse, and are automatically erased if the code protect state of the EEPROM fuse is sought to be reset, and the EEPROM fuse is reset only after the erasure of the memory contents.

6 Claims, 1 Drawing Sheet

CODE PROTECTION IN MICROCONTROLLER WITH EEPROM FUSES

BACKGROUND OF THE INVENTION

The present invention relates generally to semiconductor microprocessors, a class of which known as microcontrollers perform selective control functions, and more particularly to an improved microcontroller with code protection.

The evolution of microprocessors into complex instruments and machines has led to sophisticated, fast real-time control capability. Microprocessors of 8, 16 or 32 bit capability with associated interrupt handler chips, programmable timer chips, ROM and RAM chips, have been replaced in many control function instances by single chip microcontrollers with all peripherals embedded on the same chip with the microcontroller. Operation of the chip in an expanded mode enhances the versatility of all on-chip features.

Microcontrollers have a wide diversity of applications. In hand-held devices such as pocket pagers (beepers), the microcontroller is responsive to received characters to interpret them, produce an audible or vibratory signal to notify the user of an incoming message, and produce multiple alphanumeric messages on a suitable display such as an LCD. The microcontroller can recall from its internal memory any or all of the messages received in a given period of time. Among other instrumentation uses are those as meters and testers, capable of carrying out thousands of tests, each in a millisecond or less.

Other applications include keyboard controllers for personal computers, in which the microcontroller serves to offload many tasks formerly handled by the processor, including continuous performance of numerous diagnostic procedures and notification to the processor if a problem is detected. Personal computer applications of microcontrollers include use in modems for command interpretation and data transmission, in printer buffers for high speed dumping of data in preparation for driving the printer at the appropriate speed, and in color plotters, copiers, electronic typewriters/word processors, cable television terminal equipment, lawn sprinkling controllers, credit card phone equipment, cellular telephones, fax machines, automotive applications such as engine control modules, antilock braking systems, automobile suspension control, keyless entry systems, and a host of other industrial and consumer applications.

Typically, a microcontroller includes, among other things, a CPU (central processing unit), a program memory from which the CPU fetches instructions, and a data memory (also called a register file in some architectures) which is readable and writable directly by the CPU. The CPU fetches an instruction from the program memory and addresses the data memory according to an address obtained through the instruction or through an indirect register. The CPU may also operate in conjunction with certain peripherals to perform the control function, including devices such as timers, signal ports, and baud rate generators, among others.

Several addressing modes are common once the instruction is fetched. In some instances an embedded address tells the CPU which data memory location to modify with the current operation. This is a standard architecture for a microcontroller with on board (on chip) memory.

The present invention is directed to microcontroller devices offering code protection. Often, the device manufacturer or the OEM (original equipment manufacturer) who is the initial customer for the device desires to incorporate a code within one or more memories of the microcontroller to prevent instructions in the program memory or data within the data memory from being read out external to the device, or to prevent reprogramming of one or both of those memories.

If, as implemented according to the invention, nonvolatile memory such as electrically erasable (alterable) programmable read only memory (EEPROM) fuses are employed for the code protection, a significant advantage can be obtained. Such fuses may be tested both on and off, and reset to the proper configuration or state (i.e., "1" or "0", as the case may be) by the device manufacturer at final test. An existing technique of code protection employs an EPROM fuse which, by virtue of its plastic packaging (i.e., no capability of exposure to ultraviolet light for erasing the state of the fuse without destruction of the package), is programmable only once. Thus, once the OTP (one-time programmable) EPROM fuse is set for code protection, there is no way to reset it, so the protected data cannot be retrieved or otherwise tampered with.

The problem with such OTP EPROM code protect fusing is that, once set, everyone is locked out, including the device manufacturer. As a practical matter, it is highly desirable to have the capability to test the device one or more times at the factory during the final test stage or during iterative checkout of various program instructions in the program memory. By contrast, an inherent nature of the EEPROM is its capability to be erased and rewritten electrically. Using such a memory cell as a fuse allows the manufacturer to enter the coded instructions or data, as desired, and set and reset the code protection fuse as often as necessary for test purposes. After all testing has been satisfied, the EEPROM fuse is reset to the state to preclude penetration of the code.

However, this presents the problem of how one can reasonably assure with such an implementation that the code protection cannot be broken thereafter. It is axiomatic that if code protection fuses can be set and reset at will at the factory, the distinct probability exists that an unauthorized user can perform the same actions through an appropriate sequence of commands to gain access to or change the "protected" code in the memory.

Accordingly, it is a principal object of the present invention to provide a technique for permanently preventing access to code contained in a microcontroller or other microprocessor memory, once the memory or selected portions thereof are encoded by an authorized party.

Another object of the invention is to provide EEPROM code protection fuses and additional safeguards for coded memory in a microprocessor or microcontroller device.

SUMMARY OF THE INVENTION

The problem sought to be solved by the invention was to enable iterative setting and resetting of code protection fuses for device test purposes at the factory, by means of EEPROM fuses, while substantially deterring any subsequent defeat of the code protection in the field thereafter. The solution according to the invention utilizes the basic concept of a logic sequence in which protected data (which may include program instructions as well as digital data, in the broadest sense of that term) in the memory is erased, and all words in the memory are programmed to the data from the most recent "load" command, automatically, whenever the code protection fuse state is sought to be changed.

That is, the logic sequence results in the occurrence of two distinct and inviolable steps over an operating cycle of the device when the EEPROM fuse state is tampered with: during the first half cycle following that event, the entire data memory or program memory is erased; and during the second half cycle, the state of the code protection fuse is changed.

Thus, whenever the code is sought to be broken by bypassing the fuse to reach the coded data (or whenever a change of state of the fuse from its code protect state is undertaken, including at the factory) the entire content of the memory which is code protected by that fuse is erased, and then the state of the fuse undergoes the change. The preferred (but not mandatory) logic sequence is further arranged such that coincident with the latter event, an entire new set of arbitrary data is written from the most recent "load" command into the program memory, and the lower 8 bits are written into the data memory. The result is the loss of ability of the "user" to retrieve the old protected data because it has been erased. Hence, an attempt to gain access results in permanent loss of the protected data, and in that respect it remains protected.

Of course, the device manufacturer may then simply rewrite the memory with the desired contents to be code protected, and then reset the EEPROM code protection when the final testing has been completed at the factory. Typically, however, that is done by the OEM after the device has been supplied in volume quantities by the manufacturer.

Therefore, a further object of the invention is to provide code protection of a memory in a microcontroller device, using an EEPROM fuse and a logic sequence that evokes erasure of code protected data in the memory when the fuse is reset.

BRIEF DESCRIPTION OF THE DRAWINGS

The above and other objects, features and advantages of the invention will become clear from the following detailed description of the best mode presently contemplated for practicing the invention, with reference to the accompanying drawings in which.

DETAILED DESCRIPTION OF THE PREFERRED EMBODIMENT AND METHOD

Figure 1:
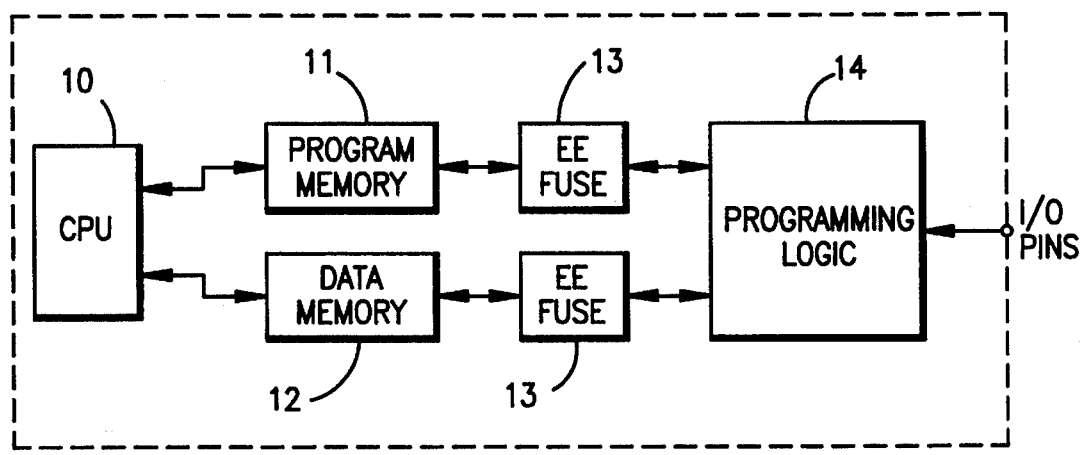
FIG. 1 is a simplified block diagram of a semiconductor integrated circuit chip on which a microprocessor or microcontroller CPU, associated program memory and data memory, EEPROM code protect fuses and programming logic for the device are fabricated.

In FIG. 1, a microcontroller CPU 10 is associated and interacts with a program memory 11 in which instructions are stored. The CPU fetches instructions from the program memory for execution during operation of the microcontroller device. Data resulting from the operation, by which an external system (not shown) is controlled, is written by the CPU to selected address locations of a data memory 12 which also contains data previously loaded for control purposes. One or more EEPROM fuses 13 are provided for code protecting the contents of one or both memories. Although two fuses are shown in FIG. 1 for the sake of clarity, in the preferred embodiment a single EEPROM fuse code protects both memories.

Programming logic 14 coupled to I/O pins of the device controls the fuses in the read/write paths. When enabled, the fuse encodes the data being read from the program memory 11, and causes the data read from the data memory 12 to be all "1's", for example. Also, writing to the program memory or the data memory through the external programming mode is inhibited when the code protection is active.

The various components may be fabricated as part of the microcontroller device in a single semiconductor integrated circuit chip 15 by use of known wafer fabrication process technology.

Figure 2:
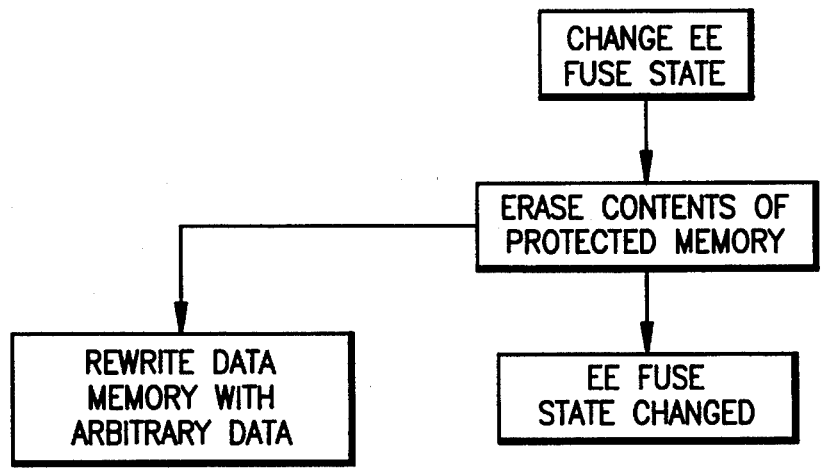
FIG. 2 is a flow diagram of the logic sequence which is followed when a change of state of an EEPROM code protect fuse is commanded.

Referring now to FIG. 2 as well, according to the invention the logic reacts to any instruction seeking to change (convert) the state of an EEPROM code protection fuse 13, which is bistable (binary), by commencing a sequence of the type illustrated in the flow diagram. It should be noted that fuse modification is from outside, when in a test mode. Such an instruction would typically be a write command to the fuse memory cell to change its content from a "1" to a "0", or vice versa, as the case may be, to disable the code protection and thereby gain access to the contents of the code protected memory. However, the same result would occur if the "instruction" were the result of a destructive process performed in an attempt to disable, the fuse.

In the preferred embodiment and method, the logic sequence performed in response to any such instruction to the fuse 13 is, first, to erase the contents of the protected memory 11 or 12, as the case may be (or both, if both are code protected), and second, to proceed with the change of state of the fuse. These two operations are performed in successive halves of a programming cycle of the device. In addition, after the protected contents are erased (rendering them invulnerable to retrieval), a further safeguard is implemented by causing the memory to be rewritten with arbitrary data from the mose recent "load" command.

It is desirable to implement the logic to erase the contents of both the program memory and the data memory even if only one of the two is code protected by an EEPROM fuse, to further discourage the possibility of retrieval of any useful information from the device by tampering. Such an implementation may be performed in a straightforward manner without any special techniques.

To allow the manufacturer to reset (disable) the code protect fuse for purposes of device testing, a reset sequence is implemented in the device logic. The logic is arranged in any event, however, so that a code protect fuse cannot be reset without erasing and rewriting the memory (both memories in the preferred embodiment). If the reset sequence is not followed precisely, the memory is not erased or rewritten, and the fuse is not reset. An exemplary reset sequence for disabling the code protect fuse is:

1) Enter external program mode.

2) Increment counter to point to memory location of fuse.

3) Perform function to enable even rows.

4) Perform function to enable odd rows.

5) Perform load command to load data for resetting code protect fuse.

6) Perform program command.

After completing the program command, the code protect fuse undergoes reset and all memory locations are programmed with the data entered through the "load data" command.

A preferred embodiment constituting the best mode presently contemplated for practicing the invention has been described. However, it will be apparent to those skilled in the art that modifications may be made without departing from the true spirit and scope of the invention. Accordingly, it is intended that the invention shall be limited only as required by the appended claims and the rules and principles of applicable law.

What is claimed is:

1. A semiconductor microcontroller device fabricated at least in part on an integrated circuit chip for controlling the operation of an external system, comprising:

a central processing unit (CPU), a program memory adapted to store instructions for execution by the CPU to control the operation of said external system, a data memory adapted to be written to for storing selected data in a multiplicity of address locations of the data memory and to be read for selective retrieval of the stored data by the CPU in conjunction with its control function, an electrically erasable programmable read only memory (EEPROM) fuse connected to at least one of said program and data memories and arranged and adapted to be set to a first state to code protect the contents of said at least one of said program and data memories to which said fuse is connected, and to be reset to a second state to remove the code protection, and logic means, connected to the EEPROM fuse and to each of said program and data memories, for erasing the contents of the memory protected by said fuse during a first half of a programming cycle of the device and for resetting said EEPROM fuse during a second half of said programming cycle.

2. A semiconductor microprocessor device for controlling the operation of an external system, comprising:

a semiconductor memory for storing data to be used in the control function of the device, an EEPROM cell having a protect state and a non-protect state and interconnected to said semiconductor memory for selectively protecting the contents of the memory when in the protect state, and adapted to be convertible from the non-protect state to the protect state and vice versa, and logic means interconnected to said EEPROM cell and responsive to attempted conversion of the EEPROM cell from the protect state to the non-protect state, for initiating erasure of protected contents of the memory during a first half of a programming cycle of the device and before allowing said conversion of said EEPROM cell to the non-protect state, so that removal of protection of the contents of the memory by said EEPROM cell takes place only after the protected contents are erased and during a second half of the programming cycle.

3. The device of claim 2, wherein:

the logic means is further responsive to said attempted conversion for writing arbitrary data to the memory after the protected contents of the memory have been erased.

4. In a semiconductor microcontroller device for controlling an aspect of the operation of an external system, in which the device includes a CPU, program memory for storing instructions to be selectively executed by the CPU to perform the control functions, and data memory adapted to be written to for storing data in selected addresses of the data memory and to be read for selective retrieval of the stored data by the CPU within its control function, the improvement comprising:

electrically erasable programmable EEPROM memory cell means, connected to at least one of said program and data memories, for code protecting the contents of said at least one of said program and data memories when the EEPROM cell means is programmed and for removing the code protection when the EEPROM cell means is erased, and logic means, connected to each of said EEPROM cell means and said memories, for generating a first electrical signal during a first half of a programming cycle of the device to always erase the contents of said at least one code protected memory in anticipation of an attempted erasure of the EEPROM cell means, before generating a second electrical signal during a second half of the programming cycle to allow erasure of the EEPROM cell means.

5. A method for code-protecting a semiconductor microcontroller device having a central processing unit (CPU), a program memory adapted to store instructions for execution by the CPU to control the operation of said external system, a data memory adapted to be written to for storing selected data in a multiplicity of address locations of the data memory and to be read for selective retrieval of the stored data by the CPU in conjunction with its control function, and interface logic for generating pulses to reset the memories, said method comprising the steps of:

providing an electrically erasable programmable read only memory (EEPROM) fuse in operative relation to each of the program memory and the data memory, enabling said EEPROM fuse to be set to a first state to code protect the contents of at least one of said program memory and said data memory, and to be reset to a second state to remove the code protection, and providing device logic to generate consecutive erase and programming pulses during successive halves of a programming cycle of the device to first erase a protected one of said memories with said erase pulse and thereafter to erase said EEPROM fuse with said programming pulse so that removal of protection of the contents of one of said memories by said EEPROM cell takes place only after the protected contents are erased.

6. A method of code-protecting a semiconductor microcontroller device which includes a CPU, program memory for storing instructions to be selectively executed by the CPU to perform control functions, and data memory for storing data in selected addresses thereof for selective retrieval of the stored data by the CPU in connection with the control function, the method comprising the steps of:

placing an EEPROM fuse in circuit with at least one of said program and data memories for code protecting the contents of said at least one memory when the EEPROM fuse is in a first state and for removing the code protection when the EEPROM fuse is in a second state, and providing control logic to erase the contents of the said at least one code protected memory during a first half of a programming pulse of the device while said EEPROM fuse in said first state and for changing said EEPROM fuse to said second state during a second half of the programming pulse and only after said contents have been erased.

* * * * *